(12) United States Patent
Rankin et al.

(10) Patent No.: US 8,912,630 B2
(45) Date of Patent: Dec. 16, 2014

(54) INTEGRATED CIRCUIT INCLUDING THERMAL GATE, RELATED METHOD AND DESIGN STRUCTURE

(75) Inventors: Jed H. Rankin, Richmond, VT (US); Robert R. Robison, Colchester, VT (US); Dustin K. Slisher, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/444,647

(22) Filed: Apr. 11, 2012

(65) Prior Publication Data
US 2013/0270678 A1  Oct. 17, 2013

(51) Int. Cl.
*H01L 27/06* (2006.01)
*H01L 21/02* (2006.01)

(52) U.S. Cl.
USPC ............ 257/536; 257/E27.024; 257/E21.004; 438/382

(58) Field of Classification Search
CPC ................................ H01L 27/06; H01L 21/02
USPC ............ 257/536, E27.024, E21.004; 438/382
See application file for complete search history.

(56) References Cited

U.S. PATENT DOCUMENTS

| | | | |
|---|---|---|---|
| 5,834,815 A | | 11/1998 | Cheng et al. |
| 6,777,784 B1 * | | 8/2004 | Vashchenko et al. ......... 257/587 |
| 6,849,921 B2 | | 2/2005 | Uenishi |
| 6,940,720 B2 | | 9/2005 | Fischer et al. |
| 7,166,913 B2 | | 1/2007 | Chinthakindi et al. |
| 7,310,036 B2 | | 12/2007 | Coolbaugh et al. |
| 7,345,364 B2 | | 3/2008 | Kerr et al. |
| 7,365,397 B2 | | 4/2008 | Nomura |
| 7,994,895 B2 | | 8/2011 | Coolbaugh et al. |
| 2008/0042798 A1* | | 2/2008 | Coolbaugh et al. ............. 338/51 |
| 2008/0102583 A1* | | 5/2008 | Pritchard et al. .............. 438/270 |
| 2011/0176278 A1* | | 7/2011 | Park et al. ..................... 361/712 |
| 2012/0146193 A1* | | 6/2012 | Stuber et al. .................. 257/618 |

FOREIGN PATENT DOCUMENTS

| | | |
|---|---|---|
| JP | 1214048 A | 8/1989 |
| JP | 9232516 A | 9/1997 |
| WO | 2005001930 A1 | 1/2005 |

OTHER PUBLICATIONS

Title: include Visited date: Aug. 26, 2013 Publisher: Oxford Dictionaries (www.oxforddictionaries.com) Pertinent Page: p. 1.*

* cited by examiner

*Primary Examiner* — Kevin Parendo
*Assistant Examiner* — Lamont Koo
(74) *Attorney, Agent, or Firm* — Michael J. LeStrange; Hoffman Warnick LLC (57) ABSTRACT

An integrated circuit (IC) and a method of making the same. In one embodiment, the IC includes: a substrate; an insulation layer over the substrate; a resistor over the insulation layer; a thermal gate over the resistor; and a heat sink connected to the thermal gate via a substrate contact, the heat sink adapted to receive thermal energy from the resistor via the thermal gate.

20 Claims, 8 Drawing Sheets

INTEGRATED CIRCUIT INCLUDING THERMAL GATE, RELATED METHOD AND DESIGN STRUCTURE

FIELD OF THE INVENTION

The disclosure relates generally to integrated circuit (IC) chips and fabrication, and more particularly, to an integrated circuit including a thermal gate, a related method and design structure.

BACKGROUND

Standard integrated circuit (IC) chip fabrication commonly includes the use of components such as resistors. These resistors are used by designers to increase the performance, functionality, and efficiency of ICs. However, during operation, the use of these resistors may generate heat which is dispersed throughout the IC and to other components. This heat may collect within the IC, elevating temperatures of the other components and portions of the IC itself. These elevated temperatures may damage and/or limit the efficiency, longevity, and effectiveness of the other components and even the IC. The limitations imposed by these resultant heated portions may influence and limit chip design and performance, causing designers to limit resistor size and current carrying capacity in order to mitigate the effects of the resistor heating. These reductions in resistor size and current carrying capacity may limit IC versatility and performance.

BRIEF SUMMARY

A first aspect of the disclosure provides an integrated circuit including: a substrate; an insulation layer over the substrate; a resistor over the insulation layer; a thermal gate over the resistor; and a heat sink connected to the thermal gate via a substrate contact, the heat sink adapted to receive thermal energy from the resistor via the thermal gate.

A second aspect of the disclosure provides a method of forming a integrated circuit including: forming a resistor in a substrate; forming a dummy gate in the substrate proximate the resistor; performing fabrication processing; removing a portion of the dummy gate; filling the portion with a conductive material to form a thermal gate adapted to receive thermal energy from the resistor; and connecting the thermal gate to a heat sink.

A third aspect of the disclosure provides a design structure tangibly embodied in a machine readable medium for design, manufacturing, or testing an integrated circuit, the design structure including: a substrate; an insulation layer over the substrate; a resistor over the insulation layer; a thermal gate over the resistor; and a heat sink connected to the thermal gate via a substrate contact, the heat sink adapted to receive thermal energy from the resistor via the thermal gate.

BRIEF DESCRIPTION OF THE DRAWINGS

The above and other aspects, features and advantages of the disclosure will be better understood by reading the following more particular description of the disclosure in conjunction with the accompanying drawings.

The drawings are not necessarily to scale. The drawings are merely schematic representations, not intended to portray specific parameters of the disclosure. The drawings are intended to depict only typical embodiments of the disclosure, and therefore should not be considered as limiting the scope of the disclosure. In the drawings, like numbering represents like elements.

DETAILED DESCRIPTION

Figure 1:
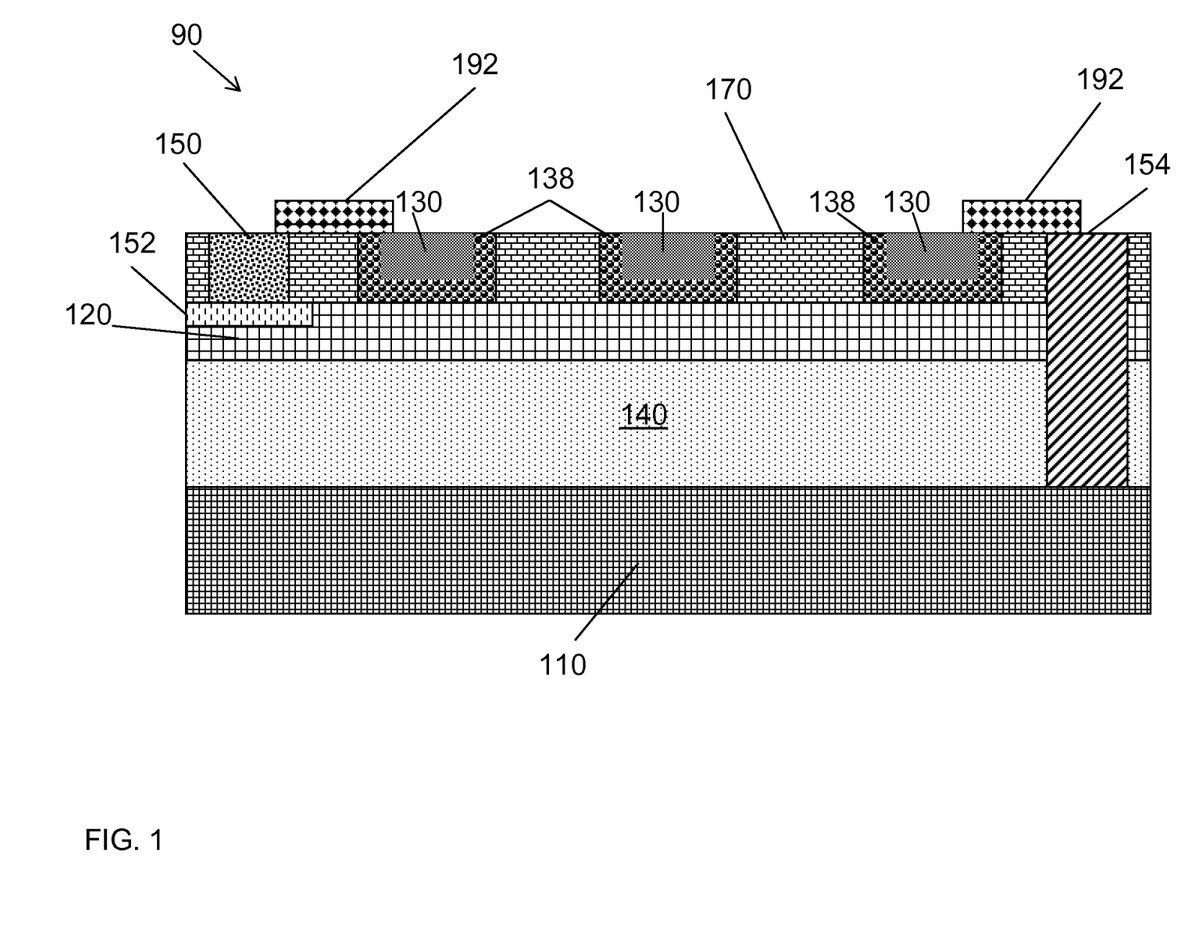
FIG. 1 shows a cross-sectional side view of portions of an integrated circuit.

Turning to the drawings, FIG. 1 shows a cross-sectional view of a portion of an integrated circuit (IC) 90 including a set of thermal gates 130. IC 90 includes a substrate 110 (e.g., wafer) upon which a series of fabrication processes (e.g., silicon on insulator processes) may be performed, including deposition of an insulation layer 140 and forming of a resistor 120. In one embodiment, each thermal gate 130 may be formed in a respective dummy gate 134 (shown in FIG. 3) in a gate layer 170 as part of the series of fabrication processes. Set of thermal gates 130 may be located proximate resistor 120 and be adapted to dissipate thermal energy (e.g., heat) from resistor 120. In one embodiment, set of thermal gates 130 may be formed adjacent resistor 120, thereby enabling thermal energy to flow from resistor 120 to thermal gates 130. Thermal gates 130 may be electrically grounded (e.g., electrically neutral) and may include metal, oxide, or other conductive materials or combinations of materials as are known. At least one of a heat sink contact 150 and a substrate contact 154 may be connected to thermal gates 130 via portions of a wiring layer 192. During operation, thermal energy may flow from resistor 120 to a heat sink 152 via thermal gates 130, wiring layer 192, and heat sink contact 150. Resistor 120 may also be connected to substrate 110 via thermal gates 130, wiring layer 192, and substrate contact 154 which extends to contact substrate 110. Thermal energy may be dissipated through either or both of heat sink contact 150 and substrate contact 154. Heat sink contact 150 and substrate contact 154 may be electrically connected to substrate 110 and may be conductive, including metals such as tungsten, doped polysilicon, amorphous silicon, or other thermally and electrically conductive materials as are known. In one embodiment, thermal gates 130, heat sink contact 150, and substrate contact 154 may be electrically grounded.

A person skilled in the art will readily recognize that location of thermal gates 130 in IC 90 may be adjusted and modified to meet design and performance needs. Further, it is understood that other structures, elements, and components have been omitted for clarity. The omitted structures may include any conventional interconnect components, passive devices, etc. It is understood that processing generally refers to a portion of the manufacturing process in which individual components and devices are patterned, interconnected, (e.g., via wiring, metallization, etc.), etched, deposited (e.g., deposition of nitride on IC 90, etching of replacement gates, etc.), etc.

Substrate 110 and/or resistor 120 may be comprised of but not limited to silicon, germanium, silicon germanium, silicon carbide, and those consisting essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Substrate 110 may also be comprised of Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The processes to provide substrate 110 and/or resistor 120, as illustrated and described, are well known in the art and thus, no further description is necessary. It is further understood that resistor 120 may further be doped to conform resistance values to design specifications and requirements.

As used herein, the term "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 2:
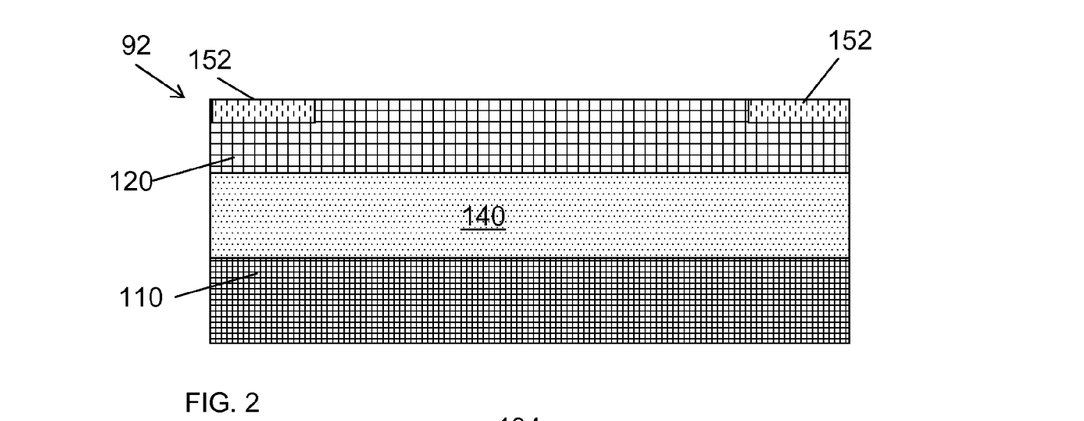
FIGS. 2-9 show cross-sectional views illustrating a method of forming portions of an integrated circuit according to embodiments of the invention.

Turning to FIGS. 2-9, cross-sectional views illustrating a process in forming an IC 94 (shown in FIG. 9) with resistor 120 and set of thermal gates 130 connected to a heat sink 152. FIG. 2 shows formation of a layered substrate 92 upon which fabrication processes are to be performed, thereby forming IC 94. The fabrication processes may include photoresist technique, replacement gate processes, deposition, etching or any other known or to be developed techniques. Layered substrate 92 includes substrate 110, insulation layer 140 and resistor 120. During formation of layered substrate 92, a set of heat sinks 152 may be formed in or through resistor layer 120 via conventional techniques (e.g., etching, deposition, etc.). Set of heat sinks 152 may include metals or other thermally conductive materials as are known. In one embodiment, insulation layer 140 may include silicon dioxide ($SiO_2$) for its insulation, mechanical and optical qualities. In another embodiment, insulation layer 140 may be comprised of, for example, a silicon oxide, sapphire, and/or a hafnium oxide. However, insulation layer 140 may also include, but is not limited to: silicon nitride ($Si_3N_4$), fluorinated $SiO_2$ (FSG), hydrogenated silicon oxycarbide (SiCOH), porous SiCOH, boro-phosho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. Insulation layer 140 may be deposited using conventional techniques described herein and/or those known in the art.

Figure 3:
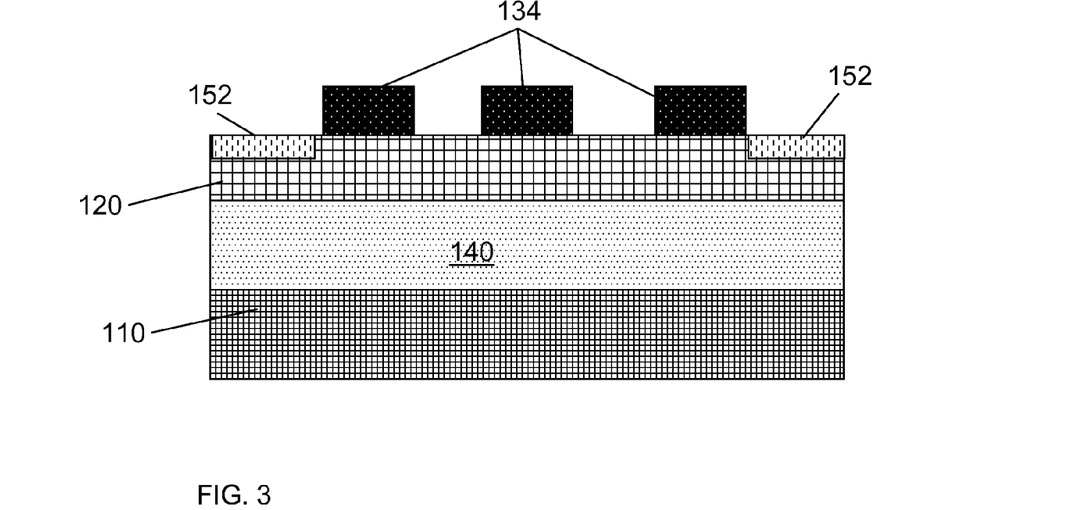

In FIG. 3, a set of dummy gates 134 are formed on resistor 120. The formation of set of dummy gates 134 may include traditional gate deposition techniques including depositing of material, patterning, etching, and any other techniques now known or later developed. In one embodiment, set of dummy gates 134 may be formed as a traditional metal gate. That is, set of dummy gates 134 may include dummy poly, oxides or any other suitable material. Any number and/or configuration of dummy gates may be located over layered substrate 92, as many other layers included in semiconductor chips now known or later developed. Dummy gates 134 may be oriented so as to accommodate cooling of resistor 120 via a set of thermal gates 130 formed in dummy gates 134 via replacement gate processes.

Figure 4:
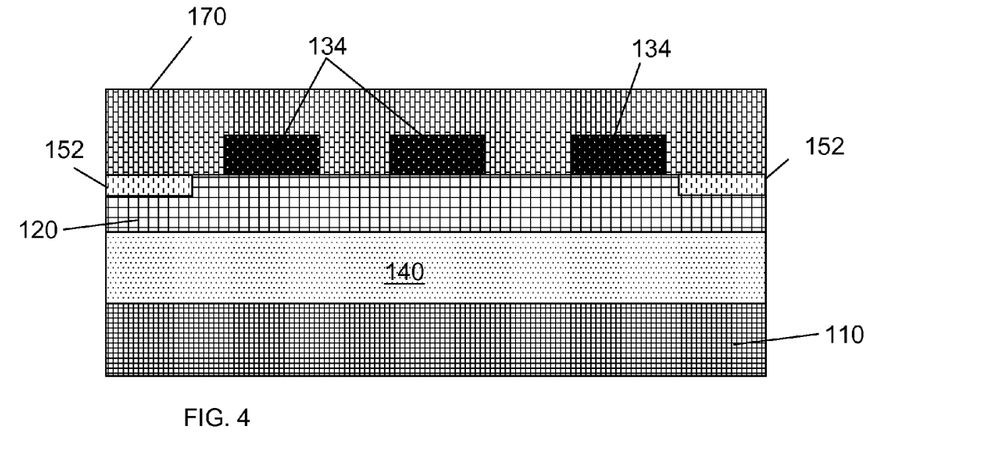
Figure 5:
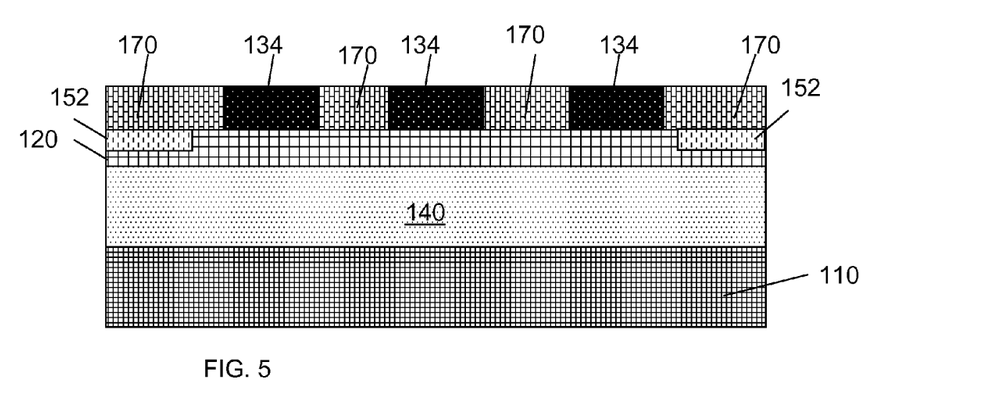

Turning to FIG. 4, a gate layer 170 is formed over layered substrate 92 and set of dummy gates 134. Gate layer 170 may be formed using any now known or later developed technique such as deposition of silicon, silicate, metal or any other known or later developed materials using PVD, CVD, etc. Gate layer 170 may be adapted to substantially cover layered substrate 92 and set of dummy gates 134. As seen in FIG. 5, gate layer 170 is planarized to about a surface of set of dummy gates 134. Planarization may include any now known or later developed technique, e.g., chemical mechanical polishing. In one embodiment, planarization of gate layer 170 exposes a surface of set of dummy gates 134.

Figure 6:
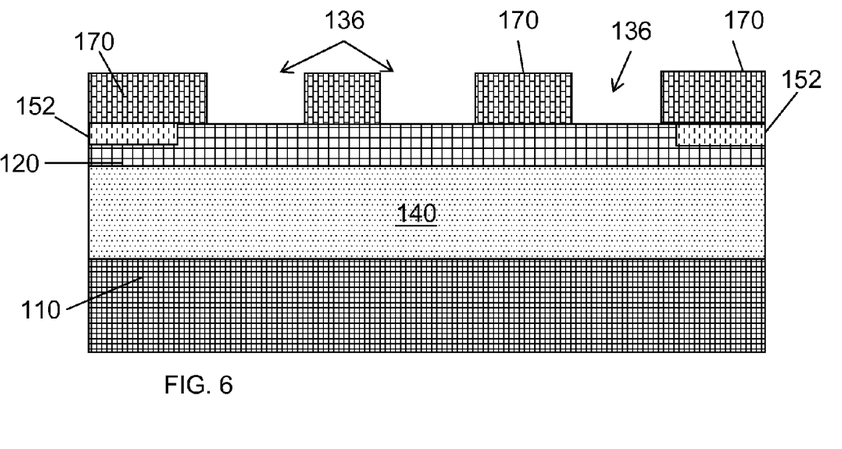

Turning to FIG. 6, set of dummy gates 134 are etched to form a set of troughs 136 in gate layer 170. It is understood that etching of resistor 120, gate layer 170, and/or set of dummy gates 134 may be performed using, for example, a reactive ion etch (RIE). As is known in the art of semiconductor fabrication, RIE uses chemically reactive plasma to remove material deposited on wafers/substrates. Differences in width between these openings may allow for utilizing a phenomenon known as inverse RIE lag. Inverse RIE lag, as is known in the art of semiconductor fabrication, causes a faster etch rate in narrower openings (higher aspect ratios) than in openings having larger widths (lower aspect ratios). Inverse RIE lag may be induced under any conditions characterized by high polymerization and high wafer self-bias voltages. In one embodiment, conditions characterized by high polymerization, may include general chemistries such as CxHyFz (Carbon-Hydrogen-Fluorine) with high oxide-to-nitride selectivity (where the blanket etch rate ratio is greater than approximately 20:1). In another embodiment, conditions characterized by high polymerization may include $O_2$ (oxygen), a dilutant, and one or more of: $C_4F_6$, $C_5F_8$, or $C_4F_8$. In this case, the dilutant may be, for example, Argon (Ar). High wafer self-bias voltages may, for example, be voltages greater than approximately 500 volts. While specific conditions for facilitating inverse RIE lag are described herein, those conditions are merely illustrative. Inverse RIE lag may be induced under other conditions not specifically described herein.

Figure 7:
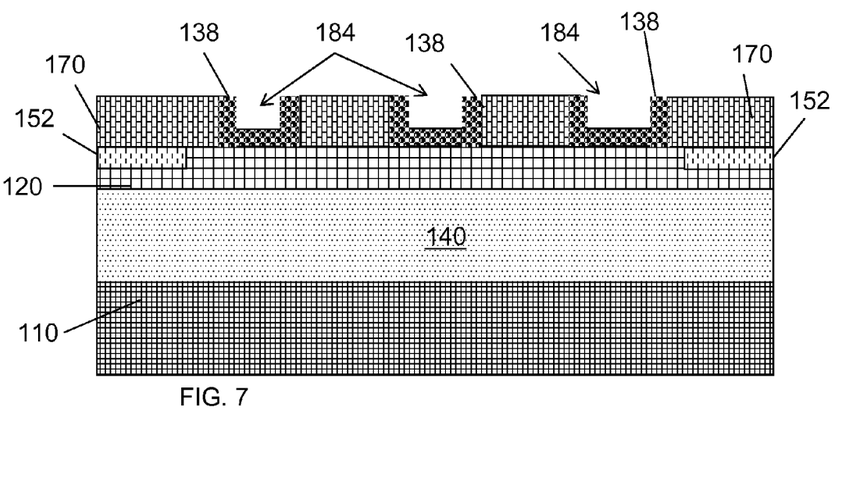
Figure 8:
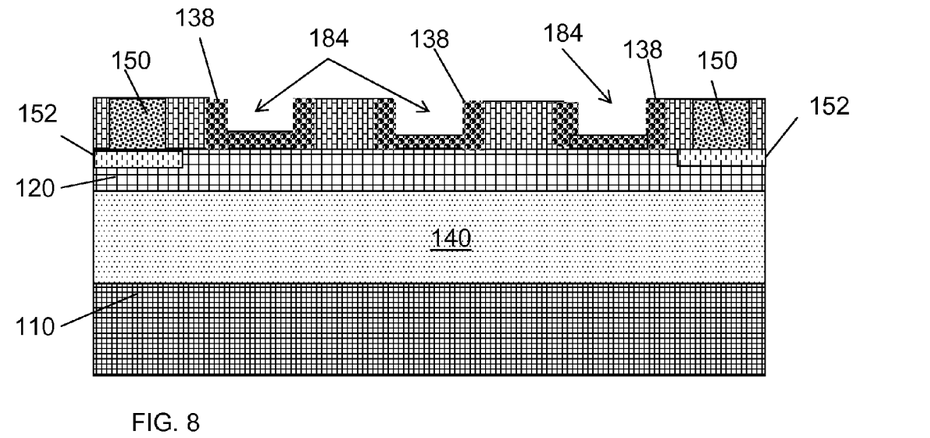

Turning to FIG. 7, an oxide layer 138 may be deposited within set of troughs 136, thereby forming a set of gate troughs 184. Oxide layer 138 may comprise an oxide and may contact resistor 120. It is understood that deposition of oxide layer 138 may be accomplished thru any method discussed herein or known, including CVD, PVD, electrochemical plating, and combinations thereof. Following the formation of set of gate troughs 184 via deposition of oxide layer 138 in set of troughs 136, as shown in FIG. 8, a set of heat sink contacts 150 may be formed. These heat sink contacts 150 may be drilled, bored, or otherwise formed through gate layer 170, resistor 120, insulation layer 140, and/or substrate 110. Heat sink contacts 150 may be formed before deposition of gate layer 170 and may be thermally conductive. In one embodiment, as shown in FIG. 1, heat sink contacts 150 may be connected to a set of heat sinks 152 adapted to receive thermal energy from resistor 120 via thermal gates 130, wiring layer 192 and heat sink contacts 150.

Figure 9:
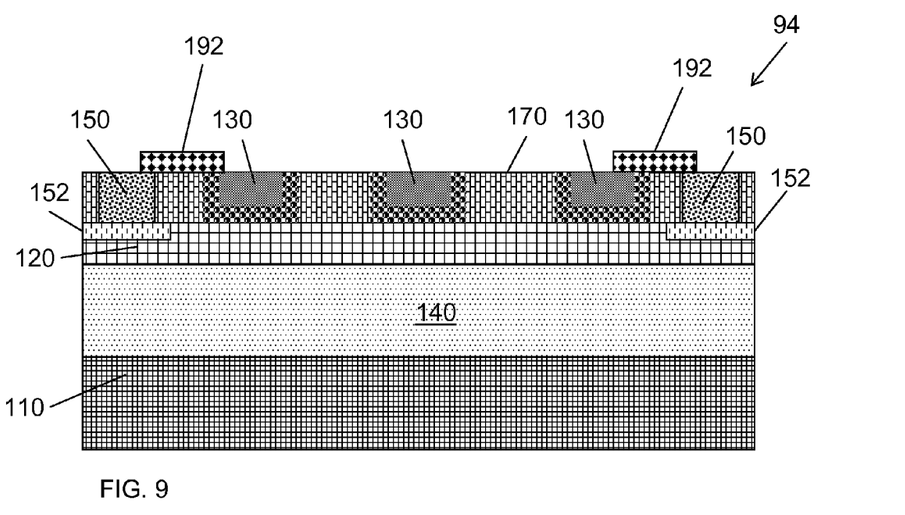

Turning to FIG. 9, a thermally conductive material is deposited within a set of gate troughs 184 to form set of thermal gates 130. Thermal gates 130 are subsequently connected to heat sink contacts 150 via formation of wiring layer 192. The thermally conductive material which comprises portions of thermal gates 130 may include metal (e.g., aluminum) or any other material as is known or later developed. In one embodiment, set of thermal gates 130 are metal. Thermal gates 130 may be electrically grounded during this process via connection to ground (e.g., substrate 110), adapted to function for thermal conductive purposes. In one embodiment, thermal gates 130 may be grounded via substrate 110.

Figure 10:
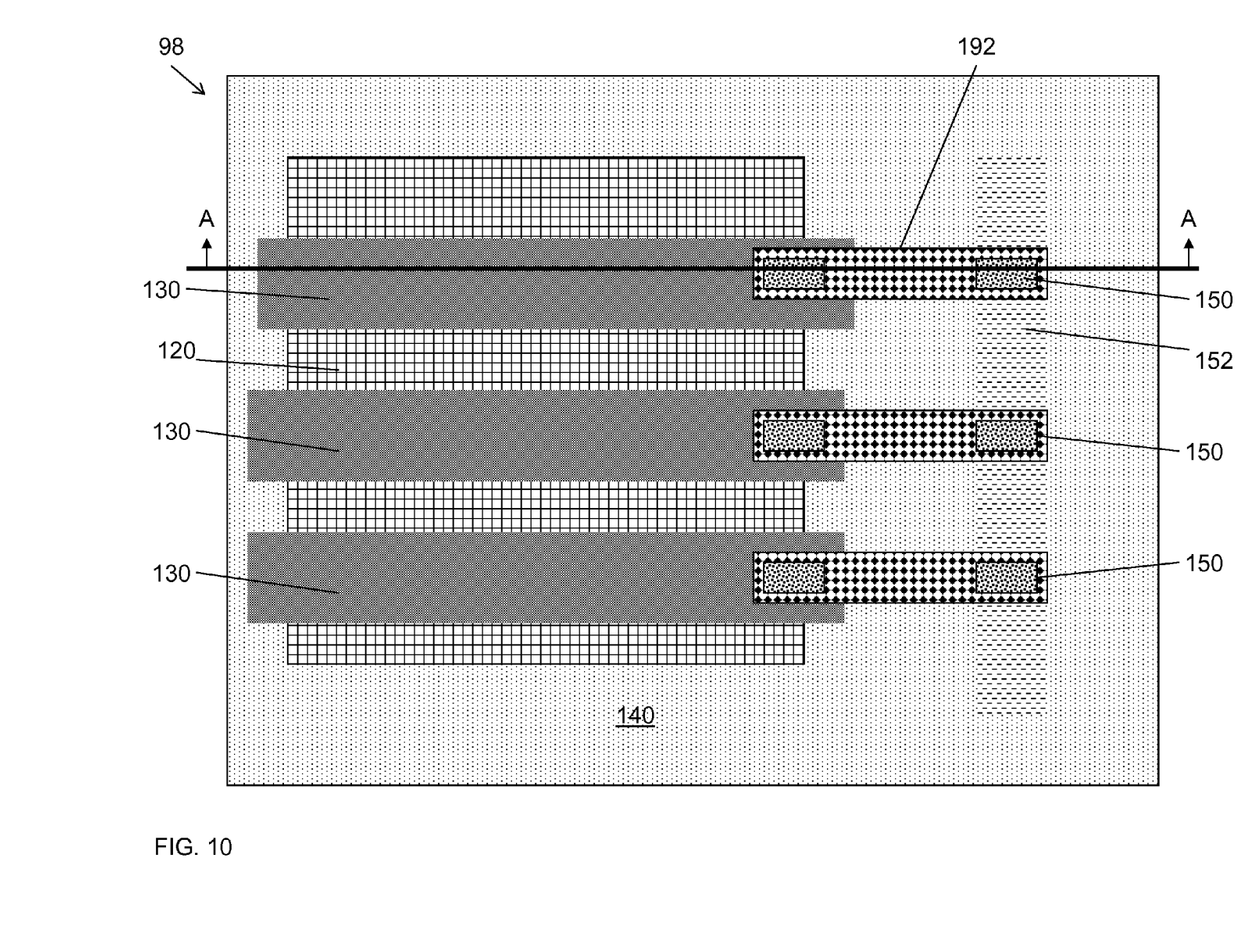
FIG. 10 shows a cross-sectional top view of portions of an integrated circuit according to embodiments of the invention.
Figure 11:
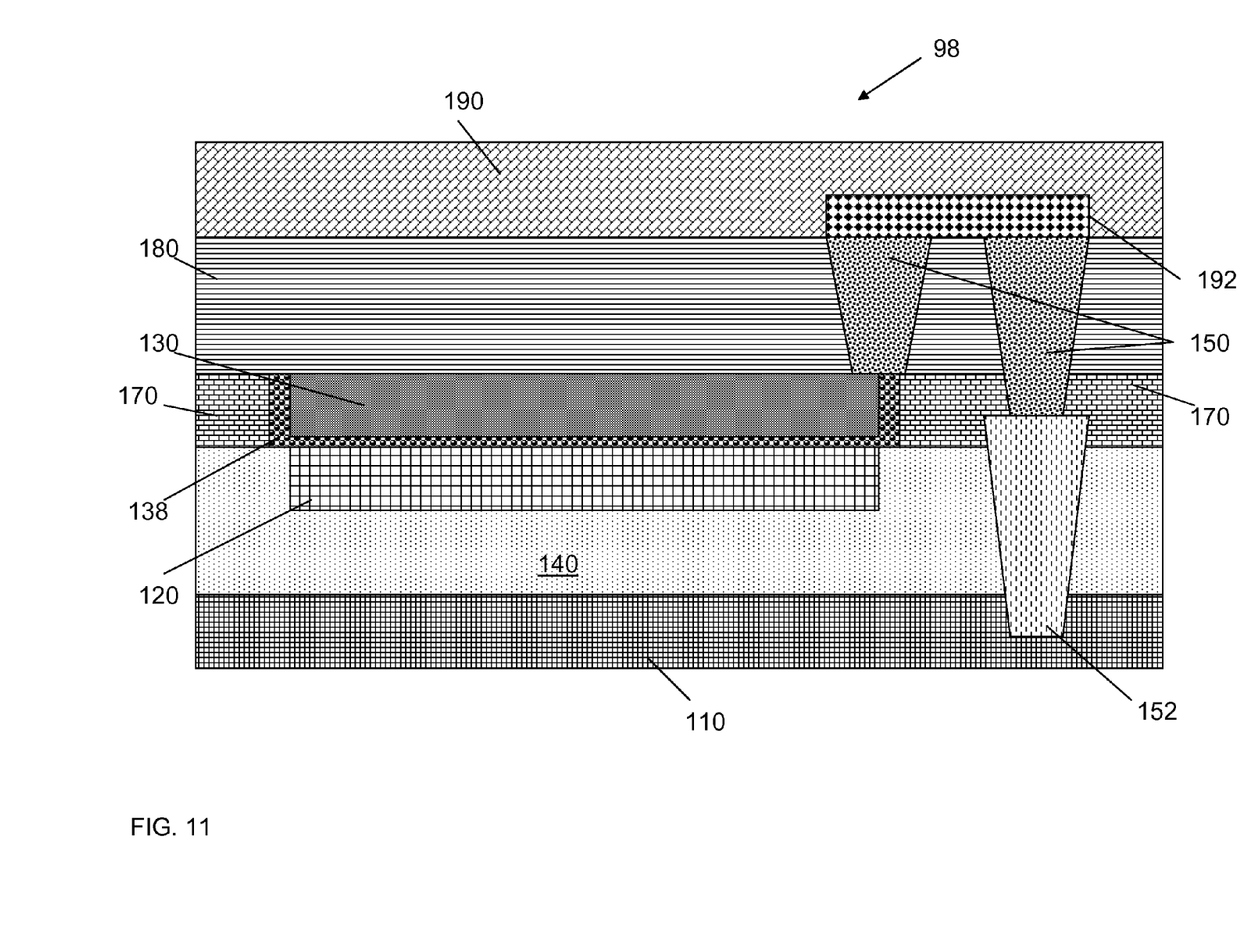
FIG. 11 shows a cross sectional view of the integrated circuit of FIG. 10 along view line A-A.

Turning to FIGS. 10-11, embodiments of a portion of an integrated circuit (IC) 98 are shown in accordance with another embodiment of the disclosure. IC 98 includes a heat sink 152 which extends to and/or contacts substrate 110, heat sink 152 being formed within a portion of substrate 110. FIG. 10 shows a top view of a portion of IC 98. FIG. 11 shows a cross-sectional view of a portion of IC 98 along line A-A in FIG. 10.

Referring to FIG. 10, a cross sectional top view of one embodiment of integrated circuit (IC) 98 is shown in accordance with embodiments of the invention. In this embodiment, resistor 120 is connected to a heat sink 152 via a set of thermal gates 130 and heat sink contacts 150. IC 98 may include a wiring layer 192 which connects heat sink contacts 150 and thermal gates 130. Wiring layer 192 may include metals and may be adapted to conduct thermal gradients about IC 98, connecting a plurality of heat sink contacts 150 such that heat sink 152 and/or substrate 110 may receive thermal energy from resistor 120 and portions of IC 98. Set of thermal gates 130 are formed in IC 98 via replacement metal gate processes and are electrically grounded. In one embodiment, heat sink 152 extends to contact substrate 110, thereby dissipating thermal energy to substrate 110. It is understood that IC 98 is merely an example of a form of IC device that may be formed and that any number of thermal gates 130 may be included in an IC device as described herein. Further, orientation and arrangement of thermal gates 130 and heat sink contacts 150 may be adjusted or determined by design constraints, process concerns, or any other design variable now known or later developed.

As shown in FIG. 11, thermal energy generated by resistor 120 may pass substrate 110 via thermal gate 130, heat sink 152, heat sink contact 150, and wiring layer 192. In this embodiment, heat sink 152 extends to contact substrate 110, thereby electrically grounding thermal gates 130 and further dissipating thermal energy obtained from resistor 120 and portions of IC 98. These components thereby form a flow path for thermal energy to flow from portions of IC 98 and resistor 120 to substrate 110. As can be seen in FIG. 11, thermal gate 130 may be grounded to substrate 110 via heat sink contacts 150 and wiring layer 192. Any of heat sink contacts 150 and wiring layer 192 may be formed in gate layer 170. In one embodiment, substrate 110 may be subjected to any number of further processes including the deposition of an oxide interlayer dielectric 180 and a second dielectric layer 190 which may include portions of wiring layer 192 and heat sink contacts 150.

Figure 12:
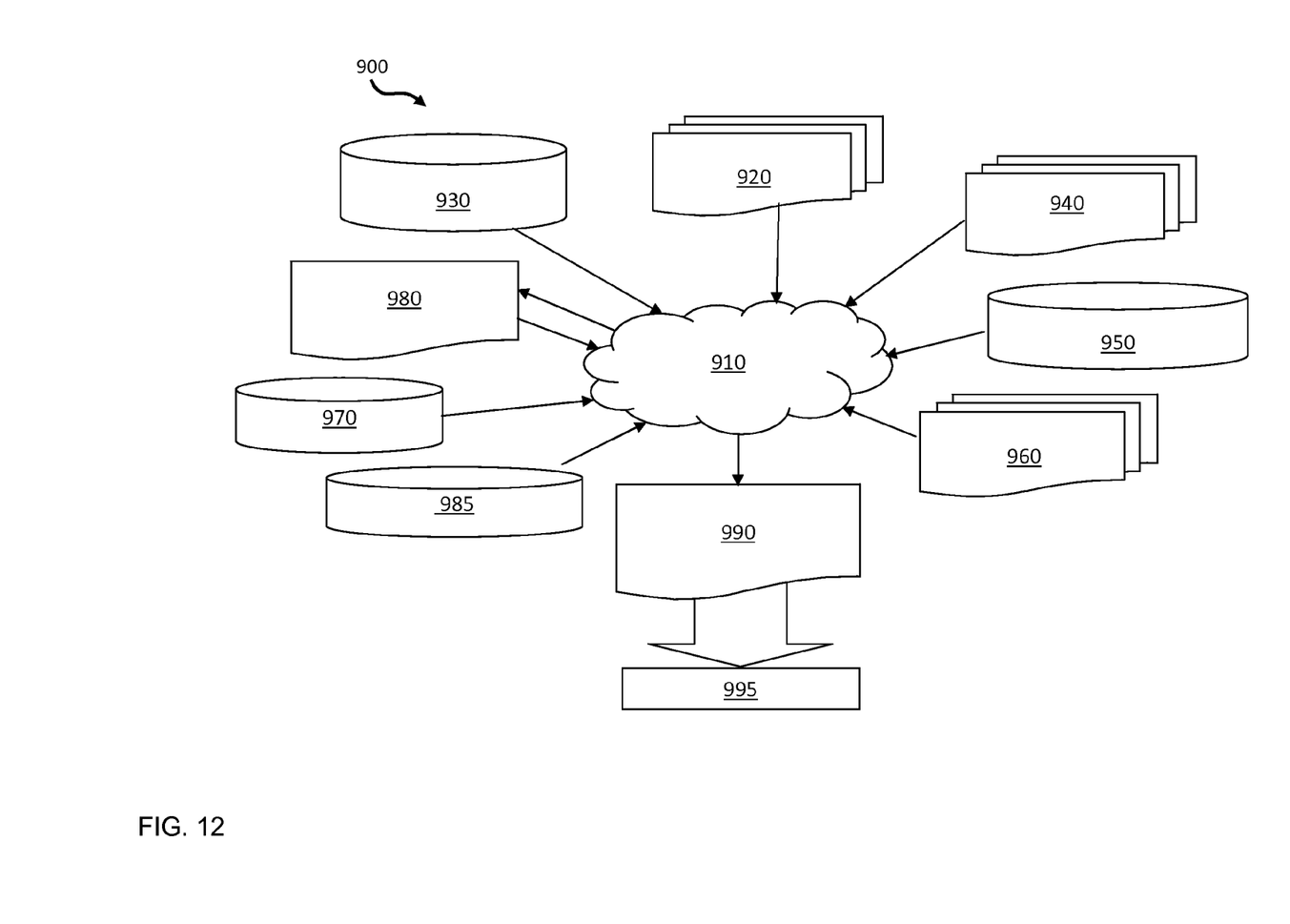
FIG. 12 shows a flow diagram of a design process used in semiconductor design, manufacture, and/or test according to embodiments of the invention.

FIG. 12 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-11. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-11. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-11 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-11. In one embodiment, design structure 990 may comprise a compiled, executable HDL simulation model that functionally simulates the devices shown in FIGS. 1-11.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-11. Design structure 990 may then proceed to a stage 995 where, for example, design structure 990: proceeds to tape-out, is released to manufacturing, is released to a mask house, is sent to another design house, is sent back to the customer, etc.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both subsurface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:
1. An integrated circuit, comprising:
a substrate;
an insulation layer over the substrate;
a resistor over the insulation layer;
a first thermal gate over the resistor without contact thereof;

a second thermal gate over the resistor without contact thereof;
a heat sink contact having a top surface that is level with a top surface of the first thermal gate and a bottom surface that is over the resistor;
a first metal layer interconnect having a bottom surface with a first portion that contacts the top surface of the first thermal gate and a second portion that contacts the top surface of the heat sink contact;
a heat sink connected to the first thermal gate via the heat sink contact and the first metal layer interconnect, the heat sink formed in a portion of the resistor, wherein the heat sink is adapted to receive thermal energy that dissipates from the resistor through a flow path that includes the first thermal gate, the first metal layer interconnect, and the heat sink contact, the flow path terminating in the heat sink; and
a substrate contact having a top surface that is level with a top surface of the second thermal gate, a bottom surface in contact with the substrate, and sidewalls having a portion in contact with the resistor, wherein the substrate contact is adapted to dissipate the thermal energy from the resistor to the substrate via the second thermal gate.

2. The integrated circuit of claim 1, wherein the substrate includes a silicon on insulator (SOI) substrate.

3. The integrated circuit of claim 1, wherein each of the first thermal gate and the second thermal gate includes metal.

4. The integrated circuit of claim 1, further comprising a nitride coating on the first thermal gate and the second thermal gate.

5. The integrated circuit of claim 1, wherein the first thermal gate and the second thermal gate are electrically neutral.

6. The integrated circuit of according to claim 1, further comprising a first oxide layer and a second oxide layer, each deposited over the resistor, wherein the first thermal gate is formed in the first oxide layer and the second thermal gate is formed in the second oxide layer.

7. The integrated circuit of according to claim 6, wherein the bottom surface of the heat sink contact is level with a bottom surface of each of the first oxide layer and the second oxide layer.

8. The integrated circuit of according to claim 6, wherein the first portion of the bottom surface of the first metal layer interconnect contacts a portion of a top surface of the first oxide layer.

9. The integrated circuit of according to claim 6, wherein the flow path further includes the first oxide layer.

10. The integrated circuit of according to claim 6, further comprising a second metal layer interconnect having a bottom surface with a first portion that contacts the top surface of the second thermal gate and the second oxide layer, and a second portion that contacts the top surface of the substrate contact.

11. The integrated circuit of according to claim 10, wherein the substrate contact is further adapted to dissipate the thermal energy through the second oxide layer and the second metal layer interconnect.

12. A design structure tangibly embodied in a machine readable medium for design, manufacturing, or testing an integrated circuit, the design structure comprising:
a substrate;
an insulation layer over the substrate;
a resistor over the insulation layer;
a first thermal gate over the resistor without contact thereof;
a second thermal gate over the resistor without contact thereof;
a heat sink contact having a top surface that is level with a top surface of the first thermal gate and a bottom surface that is over the resistor;
a first metal layer interconnect having a bottom surface with a first portion that contacts the top surface of the first thermal gate and a second portion that contacts the top surface of the heat sink contact;
a heat sink connected to the first thermal gate via the heat sink contact and the first metal layer interconnect, the heat sink formed in a portion of the resistor, wherein the heat sink is adapted to receive thermal energy that dissipates from the resistor through a flow path that includes the first thermal gate, the first metal layer interconnect, and the heat sink contact, the flow path terminating in the heat sink; and
a substrate contact having a top surface that is level with a top surface of the second thermal gate, a bottom surface in contact with the substrate, and sidewalls having a portion in contact with the resistor, wherein the substrate contact is adapted to dissipate the thermal energy from the resistor to the substrate via the second thermal gate.

13. The design structure of claim 12, wherein the substrate includes a silicon on insulator (SOI) substrate.

14. The design structure of claim 12, wherein each of the first thermal gate and the second thermal gate includes metal.

15. The design structure of claim 12, further comprising a nitride coating on the first thermal gate and the second thermal gate.

16. The design structure of claim 12, wherein the first thermal gate and the second thermal gate are electrically neutral.

17. The design structure of claim 12, further comprising a second metal layer interconnect having a bottom surface with a first portion that contacts the top surface of the second thermal gate and a second portion that contacts the top surface of the substrate contact.

18. The design structure of claim 12, further comprising a first oxide layer and a second oxide layer, each deposited over the resistor, wherein the first thermal gate is formed in the first oxide layer and the second thermal gate is formed in the second oxide layer.

19. The design structure of claim 18, wherein the bottom surface of the heat sink contact is level with a bottom surface of each of the first oxide layer and the second oxide layer.

20. The design structure of claim 18, wherein the first portion of the bottom surface of the first metal layer interconnect contacts a portion of a top surface of the first oxide layer.

* * * * *